United States Patent
Pehlke et al.

(10) Patent No.: US 10,050,529 B2
(45) Date of Patent: Aug. 14, 2018

(54) SWITCHED-MODE POWER SUPPLY WITH SWITCH RESIZING

(71) Applicant: SKYWORKS SOLUTIONS, INC., Woburn, MA (US)

(72) Inventors: David Richard Pehlke, Westlake Village, CA (US); David Steven Ripley, Marion, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/042,344

(22) Filed: Feb. 12, 2016

(65) Prior Publication Data

US 2016/0241294 A1  Aug. 18, 2016

Related U.S. Application Data

(60) Provisional application No. 62/116,495, filed on Feb. 15, 2015.

(51) Int. Cl.
| H04B 1/04 | (2006.01) |
| H02M 3/158 | (2006.01) |
| H04B 1/40 | (2015.01) |
| H02M 1/088 | (2006.01) |
| H02M 1/00 | (2006.01) |

(52) U.S. Cl.
CPC ............ *H02M 3/158* (2013.01); *H04B 1/04* (2013.01); *H02M 1/088* (2013.01); *H02M 2001/0032* (2013.01); *H02M 2001/0054* (2013.01); *H04B 1/40* (2013.01); *H04B 2001/0408* (2013.01); *Y02B 70/1491* (2013.01); *Y02B 70/16* (2013.01)

(58) Field of Classification Search
None
See application file for complete search history.

(56) References Cited

U.S. PATENT DOCUMENTS

| 7,638,991 B1 * | 12/2009 | Kobayashi ............ H02M 3/158 323/272 |
| 2001/0043060 A1 | 11/2001 | Brandt |
| 2003/0117752 A1 * | 6/2003 | Gilbert ................. H02M 3/157 361/18 |
| 2010/0014330 A1 | 1/2010 | Chang et al. |
| 2010/0238001 A1 * | 9/2010 | Veskovic ........... H05B 37/0254 340/10.42 |
| 2013/0107582 A1 * | 5/2013 | Sato ................. H02M 3/33592 363/21.06 |
| 2014/0015501 A1 | 1/2014 | Youn et al. |

(Continued)

OTHER PUBLICATIONS

International Search Report and Written Opinion for PCT/US2016/017677 dated Jun. 7, 2016.

(Continued)

*Primary Examiner* — Alejandro Rivero
(74) *Attorney, Agent, or Firm* — Chang & Hale LLP

(57) ABSTRACT

Switched-mode power supply with switch resizing. A power converter can include an inductor coupled between an input node and an intermediate node, a semiconductor device coupled between the intermediate node and an output node, and a plurality of drive transistors. Each one of the plurality of drive transistors can have a drain coupled to the intermediate node and a source coupled to a ground potential.

20 Claims, 11 Drawing Sheets

(56) References Cited

U.S. PATENT DOCUMENTS

2014/0285241 A1\* 9/2014 Umetani .............. H03K 17/162
                                                327/109
2015/0103456 A1\* 4/2015 Ghisla ...................... H02H 9/02
                                                361/79

OTHER PUBLICATIONS

PCT/US2016/017677, Switched-Mode Power Supply With Switch Resizing, filed Feb. 12, 2016.

\* cited by examiner

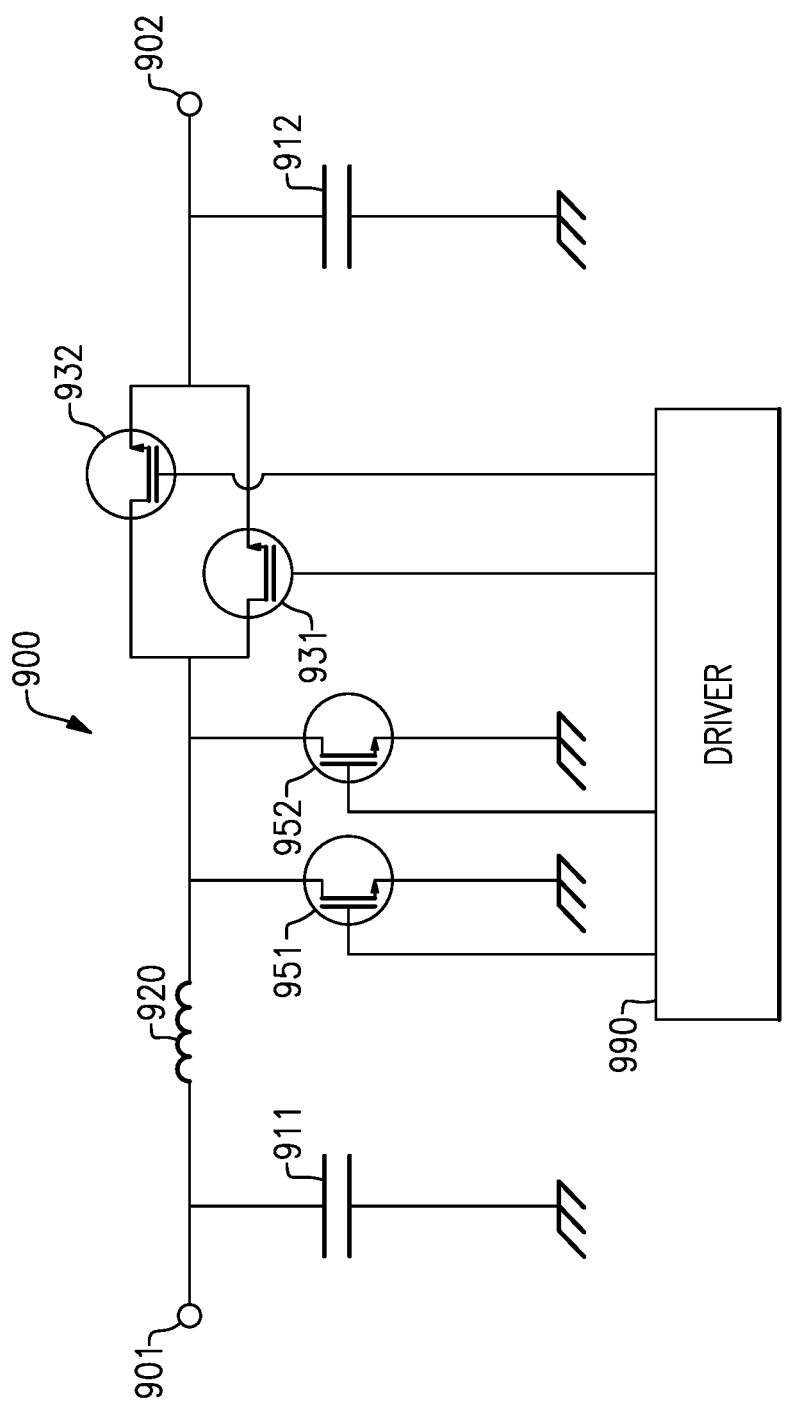

SWITCHED-MODE POWER SUPPLY WITH SWITCH RESIZING

CROSS-REFERENCE TO RELATED APPLICATION(S)

This application claims priority to U.S. Provisional Application No. 62/116,495 filed Feb. 15, 2015, entitled BOOST CONVERTER WITH SWITCH RESIZING, the disclosure of which is hereby expressly incorporated by reference herein in its entirety.

BACKGROUND

Field

The present disclosure generally relates to power converters.

Description of the Related Art

A switched-mode power supply (SMPS) can include a switch in the form of a transistor. Often, such a switch is sized for maximum load current capability, resulting in higher parasitics, such as gate-to-drain and gate-to-source capacitance, and therefore larger drive signal requirements and power consumption lost to those parasitic effects. These effects can result in a decreased efficiency of the power supply, particularly for low current outputs.

SUMMARY

In accordance with some implementations, the present disclosure relates to a power converter. The power converter includes an inductor coupled between an input node and an intermediate node and a semiconductor device coupled between the intermediate node and an output node. The power converter includes a plurality of drive transistors. Each one of the plurality of drive transistors has a drain coupled to the intermediate node and a source coupled to a ground potential.

In some embodiments, the power converter can further include a driver module. Each one of the plurality of drive transistors can have a gate coupled to the driver module. In some embodiments, the driver module can be configured to selectively drive one or more of the plurality of drive transistors. In some embodiments, the driver module can be configured to apply an oscillating waveform to at least one of the plurality of drive transistors.

In some embodiments, the driver module can be configured to receive a control signal indicative of an output state and selectively drive one or more of the plurality of drive transistors based on the control signal. In some embodiments, the driver module can be configured to, for a first output state, drive a first one and a second one of the plurality of drive transistors and can be configured to, for a second output state, drive the first one and not drive the second one of the plurality of drive transistors. In some embodiments, the first output state can be a high current output state and the second output state can be a low current output state.

In some embodiments, the driver module can be further configured to control the semiconductor device.

In some embodiments, the semiconductor device can include a diode. In some embodiments, the semiconductor device can include a transistor. In some embodiments, the semiconductor device can include a plurality of transistors connected in parallel.

In some embodiments, the power converter can further include a capacitor coupled between the input node and the ground potential. In some embodiments, the power converter can further include a capacitor coupled between the output node and the ground potential.

In some embodiments, the power converter further includes a plurality of enable transistors. Each one of the enable transistors can be coupled between a respective one of the plurality of transistors and a driver output of the driver module. Each one of the enable transistors can have a gate coupled to a respective enable output of the driver module.

In some embodiments, the power converter further includes a plurality of enable transistors. Each one of the enable transistors can be coupled between a respective one of the plurality of transistors and the ground potential or the intermediate node. Each one of the enable transistors can have a gate coupled to respective enable output of the driver module.

In some embodiments, the plurality of drive transistors can form a switch of a boost converter.

In some embodiments, the plurality of drive transistors can include at least one field-effect transistor.

In some implementations, the present disclosure relates to a radio-frequency (RF) module including a packaging substrate configured to receive a plurality of components. The RF module includes a power converter implemented on the packaging substrate. The power converter includes an inductor coupled between an input node and an intermediate node and a semiconductor device coupled between the intermediate node and an output node. The power converter further includes a plurality of drive transistors. Each one of the plurality of drive transistors has a drain coupled to the intermediate node and a source coupled to a ground potential.

In some embodiments, the RF module can be a front-end module (FEM).

In some implementations, the present disclosure relates to a wireless device including a transceiver configured to generate an input radio-frequency (RF) signal. The wireless device includes a front-end module (FEM) in communication with the transceiver. The FEM includes a packaging substrate configured to receive a plurality of components. The FEM further includes a power converter implemented on the packaging substrate. The power converter includes an inductor coupled between an input node and an intermediate node and a semiconductor device coupled between the intermediate node and an output node. The power converter further includes a plurality of drive transistors. Each one of the plurality of drive transistors has a drain coupled to the intermediate node and a source coupled to a ground potential. The FEM further includes a power amplifier powered by the power converter and configured to amplify the RF signal. The wireless device further includes an antenna in communication with the FEM. The antenna is configured to transmit the amplified RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 9 shows that in some embodiments, a boost converter can include a geometrically resizable blocking semiconductor device

DETAILED DESCRIPTION OF SOME EMBODIMENTS

The headings provided herein, if any, are for convenience only and do not necessarily affect the scope or meaning of the claimed invention.

Described herein are circuits and systems including a power converter and methods of operating a power converter. In various implementations, a power converter includes a switch with multiple transistors coupled in parallel such that a larger total periphery can be enabled for higher power when larger currents are required and the effective device size can be reduced at lower load currents when lower parasitic capacitance can be leveraged for higher efficiency.

Figure 1:
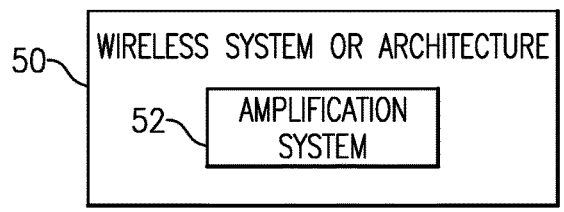
FIG. 1 shows an example wireless system or architecture.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
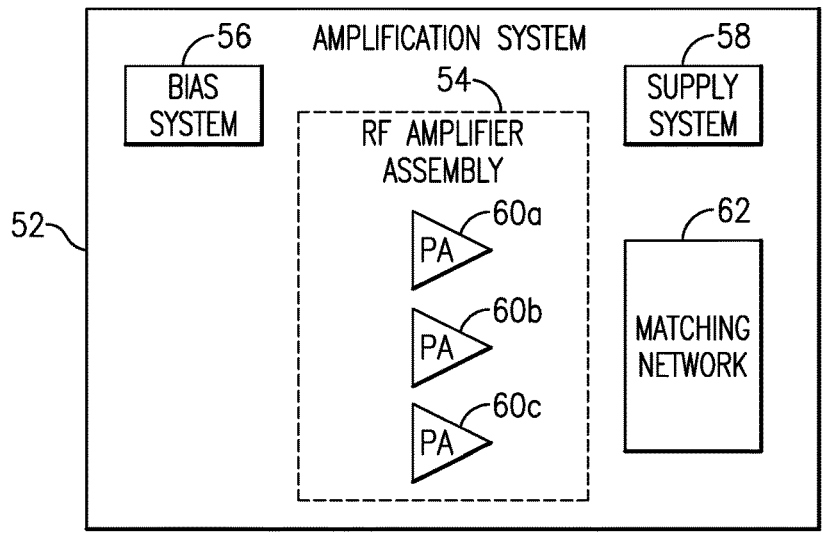
FIG. 2 shows that, in some implementations, an amplification system can include a radio-frequency (RF) amplifier assembly having one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figures 3A, 3B, 3C:
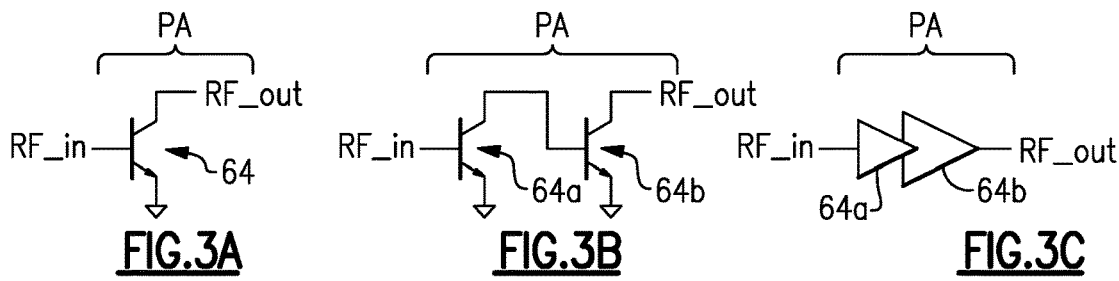
FIGS. 3A-3E show non-limiting examples of power amplifiers.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figures 3D, 3E:
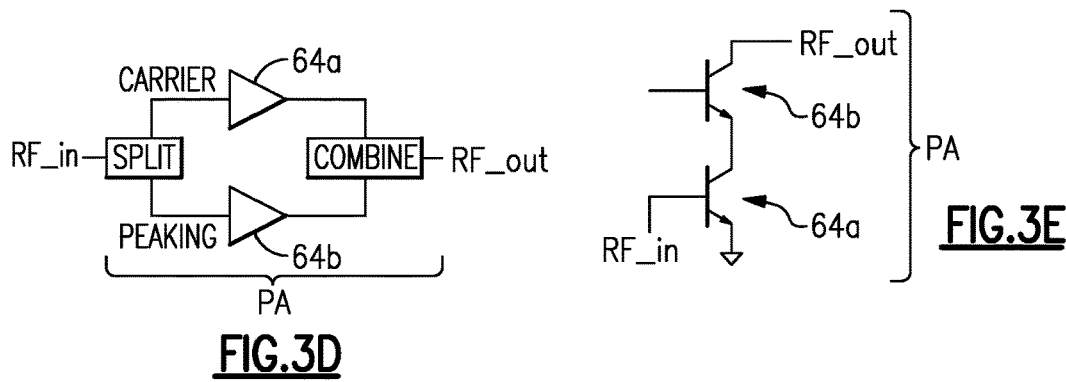

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
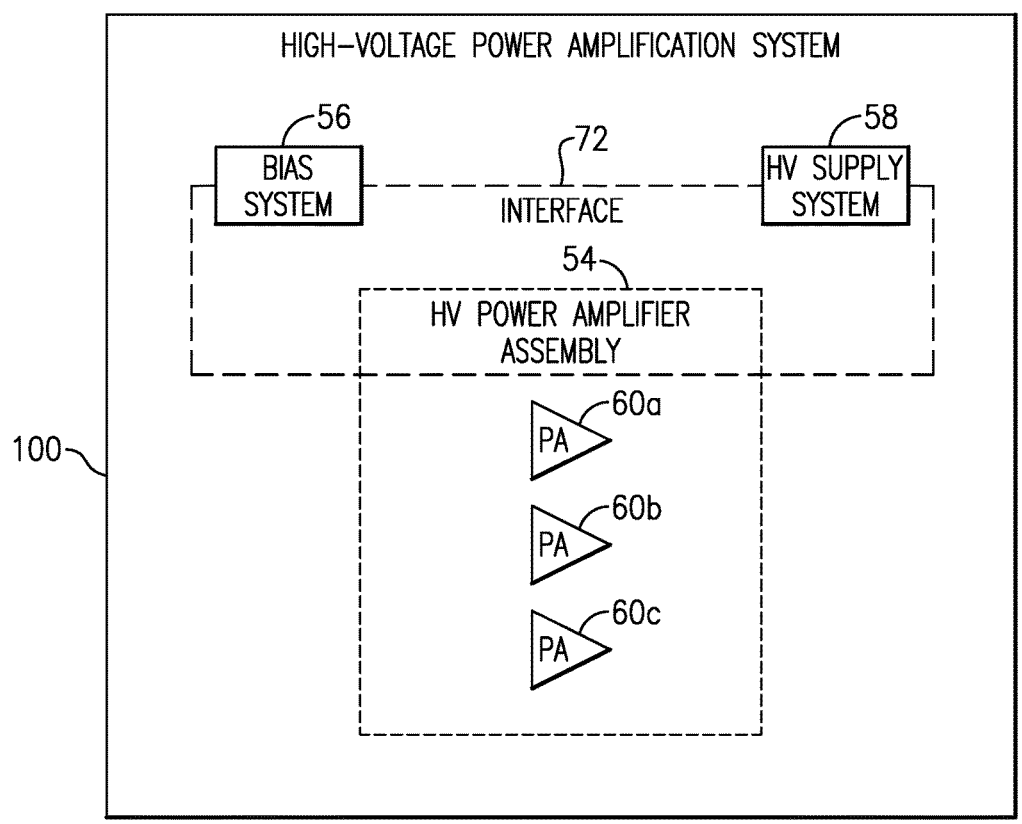
FIG. 4 shows that, in some implementations, an amplification system can be implemented as a high-voltage (HV) power amplification system.

FIG. 4 shows that in some embodiments, the amplification system 52 of FIG. 2 can be implemented as a high-voltage (HV) power amplification system 70. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

Figure 5:
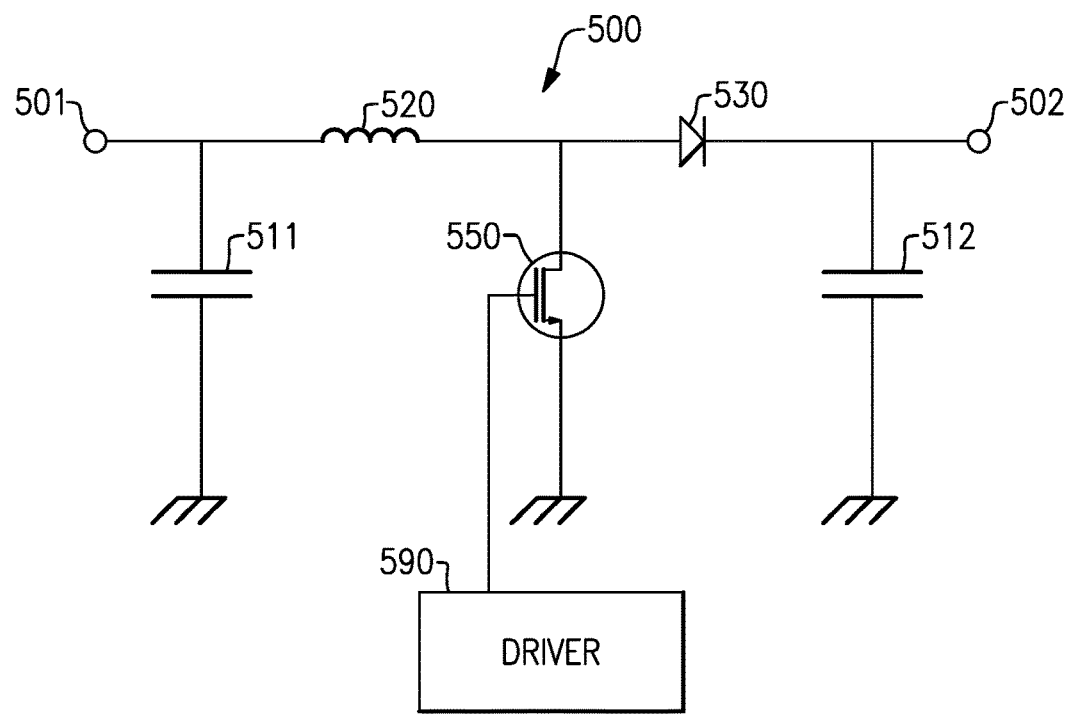
FIG. 5 shows that in some embodiments, a power amplification system may be powered by a boost converter.

FIG. 5 shows that in some embodiments, a power amplification system may be powered by a boost converter 500. Such a boost converter 500 may be implemented, for example, as part of the supply system 58 of FIG. 2 or the HV supply system 58 of FIG. 4. The boost converter 500 can be operated as a DC-to-DC power converter with an output voltage (at output node 502) greater than its input voltage (at input node 501). Although aspects of the disclosure are described herein with respect to a boost converter, it is to be appreciated that features may be implemented in other types of switched-mode power supply (SMPS) systems, including non-isolated topologies (such as a buck converter, a buck-boost converter, a boost-buck converter, SEPIC [single-ended primary-inductor converter], or a charge pump) and isolated topologies (such as a flyback converter, a half-bridge converter, or a full-bridge converter).

The boost converter 500 of FIG. 5 includes a first capacitor 511 coupling the input node 501 to a ground potential and a second capacitor 512 coupling the output node to the ground potential. The boost converter 500 further includes an inductor 520 coupling to the input node 501 to an intermediate node and a blocking semiconductor device (implemented as a diode 530) coupling the intermediate node to the output node 502. The boost converter 500 includes a switch in the form of a drive transistor 550. The drive transistor 550 has a gate coupled to a driver module 590, a drain coupled to the intermediate node, and a source coupled to the ground potential. Although the drive transistor 550 is described herein as a field-effect transistor (FET), it will be understood that the drive transistor 550 (and other transistors described herein) may be implemented with other types of transistors, such as bipolar junction transistors (BJTs) (e.g., heterojunction bipolar transistors (HBTs)). Similarly, the use of particular terms, such as "gate", "drain", or "source" should not be taken to imply a particular transistor type, and should be considered interchangeable with other terms (such as "base", "collector", or "emitter") typically used to refer to other types of transistor.

The inductor 520 resists changes in current by creating and destroying a magnetic field. When the drive transistor 550 is not biased, current flows through the inductor 520 in clockwise direction from the input node 501 and the inductor 520 stores some energy by generating a magnetic field. Polarity of the left side of the inductor is positive. When the drive transistor 550 is biased, current will be reduced as the impedance is higher. The magnetic field previously created will be destroyed to maintain the current flow towards the output node 502. Thus, the polarity will be reversed (e.g., left side of inductor 520 will be negative). As a result, two sources (the voltage at the input node 501 and the inductor 520) will be in series, causing a higher voltage to charge the second capacitor 512 through the diode 530.

If the biasing of the drive transistor 550 is cycled fast enough, the inductor 520 may not discharge fully in between charging stages, and the voltage at the output node 502 (referred to as the output voltage) may be a voltage greater than that of the voltage at the input node 501 (referred to as the input voltage) alone when the drive transistor 550 is not biased. Also, while the drive transistor 550 is not biased, the second capacitor 512 may be charged to this combined voltage. When the drive transistor 550 is then biased, the second capacitor may provide the output voltage (e.g., higher than the input voltage). During this time, the diode 530 may prevent the second capacitor 512 from discharging through the biased drive transistor 550. The drive transistor 550 may be unbiased again fast enough to prevent the second capacitor 512 from discharging too much.

Figure 6:
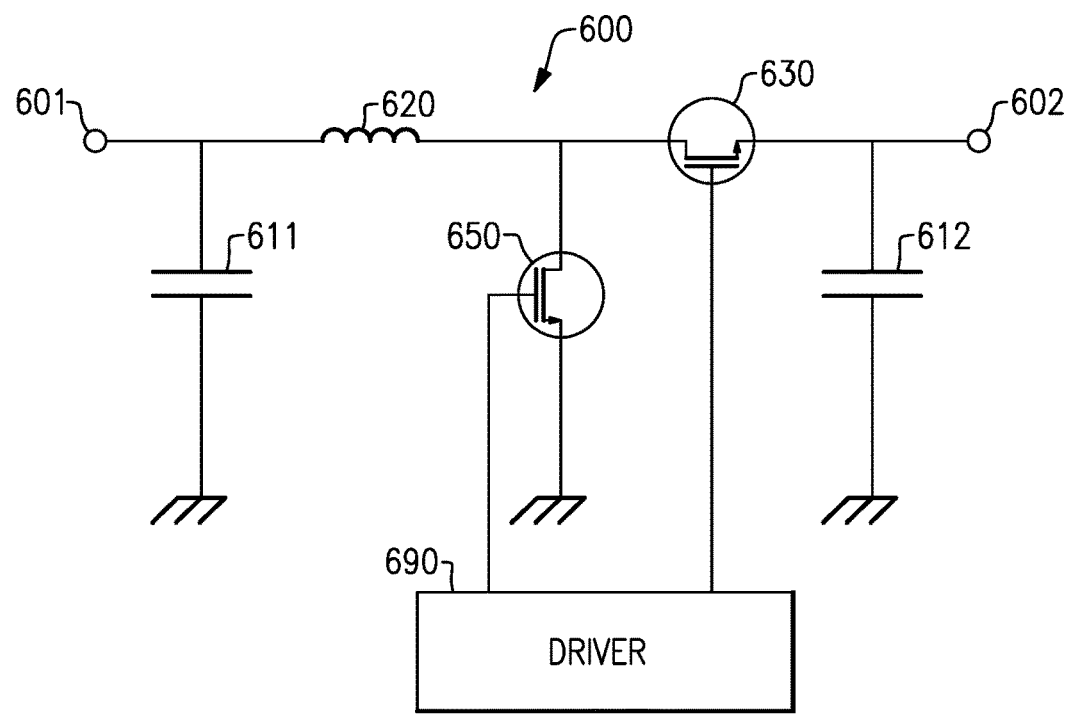
FIG. 6 shows that in some embodiments, a boost converter can include a blocking semiconductor device implemented as a transistor.

FIG. 6 shows that in some embodiments, a boost converter 600 can include a blocking semiconductor device implemented as a transistor 630. The boost converter 600 of FIG. 5 includes a first capacitor 611 coupling the input node 601 to a ground potential and a second capacitor 612 coupling the output node to the ground potential. The boost converter 600 further includes an inductor 620 coupling to the input node 601 to an intermediate node and a blocking semiconductor device (implemented as a blocking transistor 630 controlled by the driver module 690) coupling the intermediate node to the output node 602. The boost converter 600 includes a switch in the form of a drive transistor 650. The drive transistor 650 has a gate coupled to a driver module 690, a drain coupled to the intermediate node, and a source coupled to the ground potential.

In general, the blocking transistor 630 is biased (e.g., by the driver module 690) when the drive transistor 650 is not biased and the blocking transistor 630 is not biased when the drive transistor 650 is biased.

The switch of a boost converter, e.g., implemented as a single drive transistor in FIGS. 5 and 6, can be sized (e.g., on a packaging substrate) for maximum load current capability. However, this may result in higher parasitic gate-to-drain and gate-to-source capacitance and therefore result in large drive signal requirements and power consumption lost to those parasitic effects, causing decreased efficiency of the boost converter.

Described herein is an effective geometric scaling of the switch (either by segmenting the drive transistor into multiple slices and driving with separate drive signals, the use of separate bias enables, or both) such that a larger total periphery can be enabled when higher power and/or larger currents are desired, and the switch size can be reduced at lower power and/or smaller load currents to lower parasitic capacitance for higher efficiency.

Figure 7:
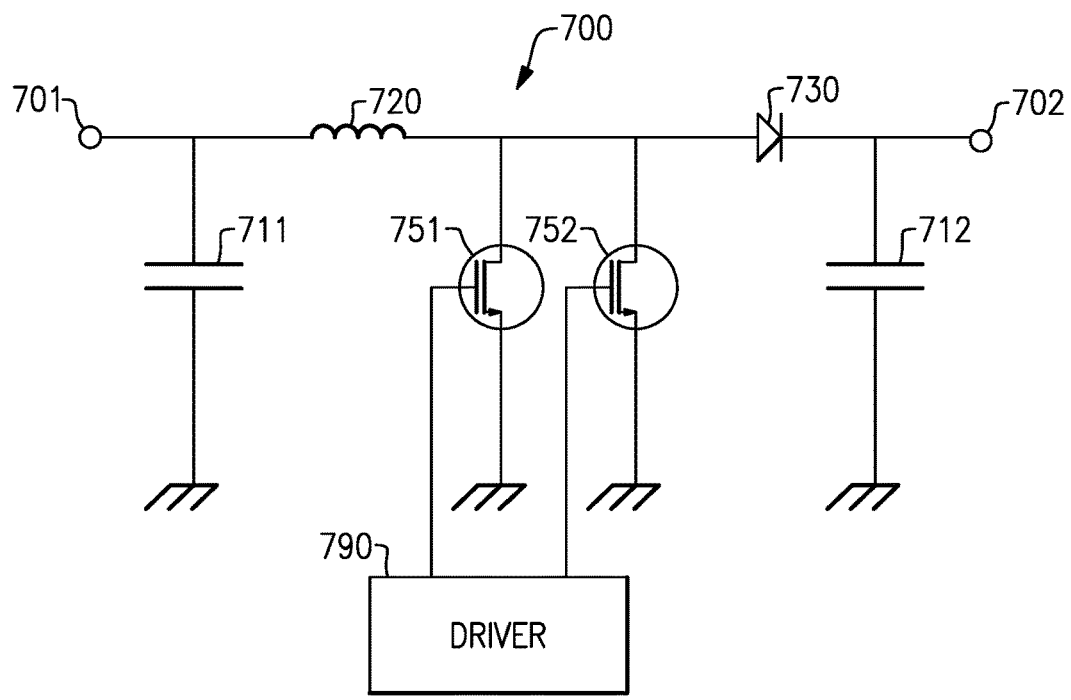
FIG. 7 shows that in some embodiments, a boost converter may include a geometrically scalable switch.

FIG. 7 shows that in some embodiments, a boost converter 700 may include a geometrically scalable switch. Like the boost converter 500 of FIG. 5, the boost converter 700 of FIG. 7 includes a first capacitor 711 coupling the input node 701 to a ground potential and a second capacitor 712 coupling the output node 702 to the ground potential. The boost converter 700 further includes an inductor 720 coupling to the input node 701 to an intermediate node and a blocking semiconductor device (implemented as a diode 730) coupling the intermediate node to the output node 702.

The boost converter 700 includes a switch implemented as a plurality of drive transistors 751-752 connected in parallel. Each one of the plurality of drive transistors 751-

752 has a gate coupled to a respective output of a driver module 790, a drain coupled to the intermediate node, and a source coupled to the ground potential.

Although two drive transistors 751-752 are shown in FIG. 7, it is to be appreciated that the switch may be implemented with three, four, or more drive transistors connected in parallel.

Figure 8A:
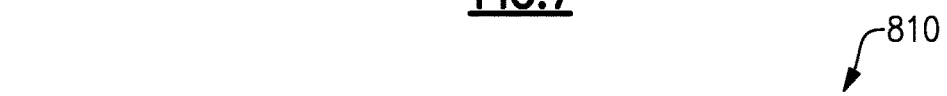
FIGS. 8A-8B show that in some embodiments, drive signals may be independently applied to each of the plurality of drive transistors by the driver module.
Figure 8B:
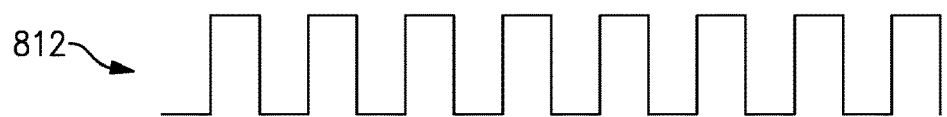

FIGS. 8A-8B show that in some embodiments, drive signals may be independently applied to each of the plurality of drive transistors 751-752 by the driver module. For high current output, a set of high current drive signals 810 including an oscillating drive signal for both a first one 811 and a second one 812 of the plurality of drive transistors may be provided by the driver module 790. For low current output, a set of low current drive signals 820 including an oscillating drive signal for only a first one of the plurality of drive transistors 822 and an off drive signal 822 may be provided by the driver module 790. Thus, for high current output, the multiple active drive transistors act as a single large-sized switch and at low current output, the single active drive transistor acts as a single small-sized switch.

In the case of three drive transistors, one of the drive transistors may be driven for low current output, two of the drive transistors may be driven for medium current output, and all three of the drive transistors may be driven for high current output. Each of the plurality of drive transistors may be the same size or of different sizes, enabling incremented effective switch size with a minimal number of drive transistors.

The driver module 790 may receive a control signal indicative of an output state, e.g., indicating whether the output desired is a high current output or a low current output, and selectively drive one or more of the plurality of drive transistors 751-752. The driver module 790 may include a table that indicates which of the plurality of drive transistors 751-752 to drive based on the control signal.

The boost converter 790 presents a larger switching device for higher efficiency during higher current loading levels and a smaller switching device with lower parasitic effects and improved efficiency during lower current loading levels. Thus, the boost converter 790 may provide higher efficiency across a wider dynamic range for boost converters, e.g. for wide dynamic range radio applications.

Driving less than all of a plurality of drive transistors can be combined with methods of pulse-skip modulation, frequency adjustment to lower switching frequencies at lower powers, and duty-cycle modulations to enable low power efficiency in the boost converter 790.

Although FIG. 8A shows equivalent oscillating drive signals for both a first one 811 and a second one 812 of the plurality of drive transistors during a high current output state, in some implementations, the drive signals can be different. For example, the drive signals can switch on a first one of the drive transistors quickly and a second one of the drive transistors more quickly to achieve a reasonable transition of the switch with lower static resistance and lower gate charging. Similarly, the drive signals can switch off a first one of the drive transistors before switching off a second one of the drive transistors, such that the smaller of the driver transistors is switched off with lower discharge loss.

FIG. 9 shows that in some embodiments, a boost converter 900 can include a geometrically resizable blocking semiconductor device. Like the boost converter 700 of FIG. 7, the boost converter 900 of FIG. 9 includes a first capacitor 911 coupling an input node 902 to a ground potential and a second capacitor 912 coupling an output node 902 to the ground potential. The boost converter 900 further includes an inductor 920 coupling to the input node 901 to an intermediate node and a blocking semiconductor device coupling the intermediate node to the output node 902.

Also, like the boost converter 700 of FIG. 7, the boost converter 900 of FIG. 9 includes a switch implemented as a plurality of drive transistors 951-952 connected in parallel. Each one of the plurality of drive transistors 951-952 has a gate coupled to a respective output of a driver module 990, a drain coupled to the intermediate node, and a source coupled to the ground potential.

In the boost converter 900 of FIG. 9, the blocking semiconductor device is implemented as a plurality of blocking transistors 931-932 connected in parallel. Each of the plurality of blocking transistors has a gate coupled to a respective output of the driver module 990, a drain coupled to the intermediate node, and a source coupled to the output node 902.

For high current output, both of the blocking transistors 931-932 are biased when the drive transistors 951-952 are not biased and both of the blocking transistors 931-932 are not biased when the drive transistors 951-952 are biased. For low current output, one of the blocking transistors 931-932 is biased when the drive transistors 951-952 are not biased and both of the blocking transistors 931-932 are not biased when one of the drive transistors 951-952 is biased.

Figure 10:
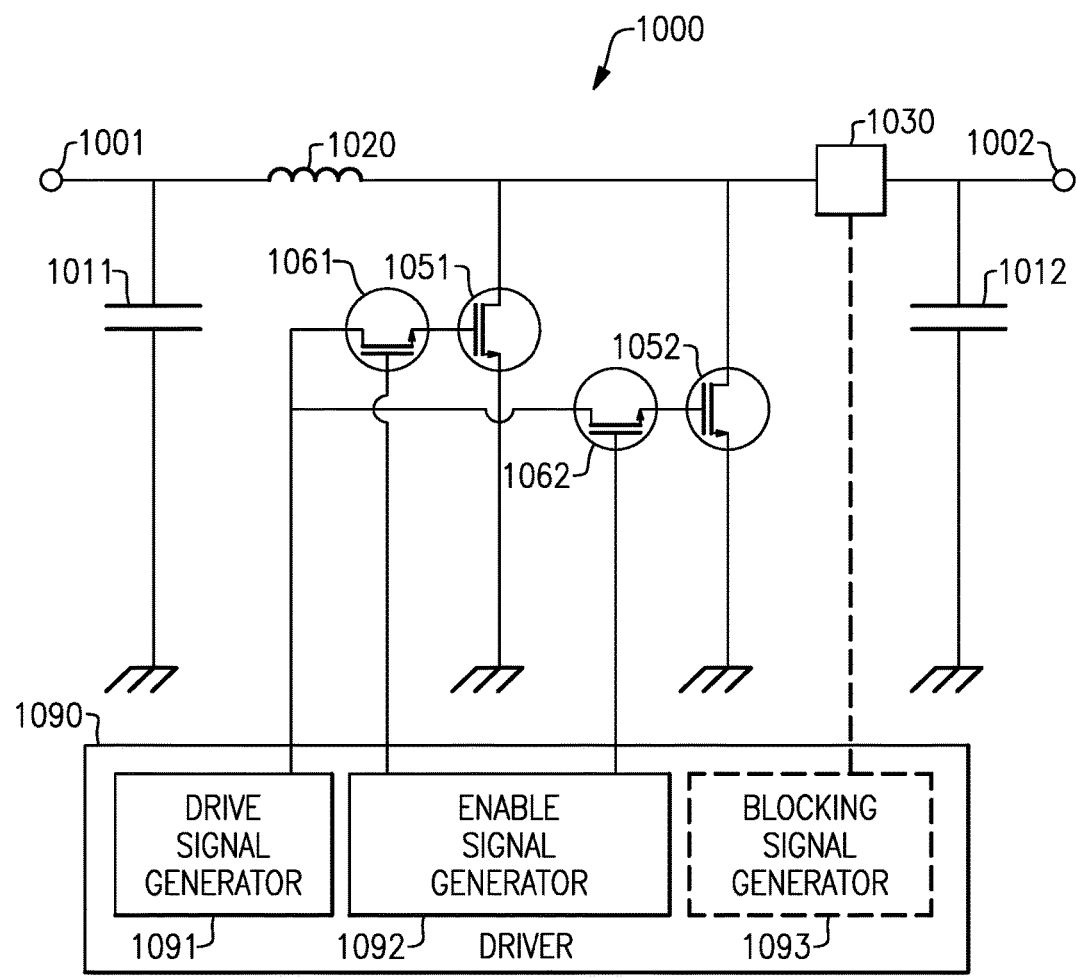
FIG. 10 shows that in some embodiments, a boost converter can include a switch with enabling transistors between a driver module and drive transistors.

FIG. 10 shows that in some embodiments, a boost converter 1000 can include a switch with enabling transistors 1061-1062 between a driver module 1090 and drive transistors 1051-1052. Like the boost converter 700 of FIG. 7, the boost converter 1000 of FIG. 10 includes a first capacitor 1011 coupling an input node 1001 to a ground potential and a second capacitor 1012 coupling an output node 1002 to the ground potential. The boost converter 1000 further includes an inductor 1020 coupling to the input node 1001 to an intermediate node and a blocking semiconductor device 1030 (which can be implemented as a diode or one or more transistors) coupling the intermediate node to the output node 1002.

Also, like the boost converter 700 of FIG. 7, the boost converter 1000 of FIG. 1000 includes a switch implemented (in part) as a plurality of drive transistors 1051-1052 connected in parallel. Each one of the plurality of drive transistors 1051-1052 has a gate coupled (via a respective enabling transistor 1061-1062) to a drive signal output of a drive signal generator 1091 of a driver module 1090, a drain coupled to the intermediate node, and a source coupled to the ground potential.

The enabling transistors 1061-1062 are disposed between the drive signal generator 1091 and the drive transistors 1051-1052. Each one of the enabling transistors 1061-1062 has a gate coupled to a respective enable signal output of an enable signal generator 1092 of the driver module 1090, a drain coupled to the drive signal output of the drive signal generator, and a source coupled to the gate of a respective drive transistor 1051-1052.

The switch configuration of FIG. 10 allows for a single drive signal output to be used for multiple drive transistors. The drive signal can be, for example, an oscillating signal as shown in FIGS. 8A-8B. By selectively enabling or disabling the enabling transistors 1061-1062 (e.g., by biasing or not biasing the enabling transistors 1061-1062), the driver module 1090 can either provide the drive signal or an off signal to each of the drive transistors 1051-1052. In some implementations, separating the drive signal generation from the enable signal generation (and the selection of one or more drive transistors based on a control signal indicative of an output state) may be beneficial. For example, the drive signal generator and the enable signal generator may be implemented on different devices or packages. Thus, the drive signal generator 1091 can include additional functionality such as pulse-skip modulation, frequency adjustment, and duty-cycle modulations.

In some implementations, the driver module 1090 includes a blocking signal generator 1093 to provide one or more blocking signals to one or more blocking transistors of the semiconductor device 1030. In some implementations, the semiconductor device includes one or more diodes (or, equivalently, one or more transistors configured as diodes) and the driver module 1090 does not include a blocking signal generator 1093.

Figure 11:
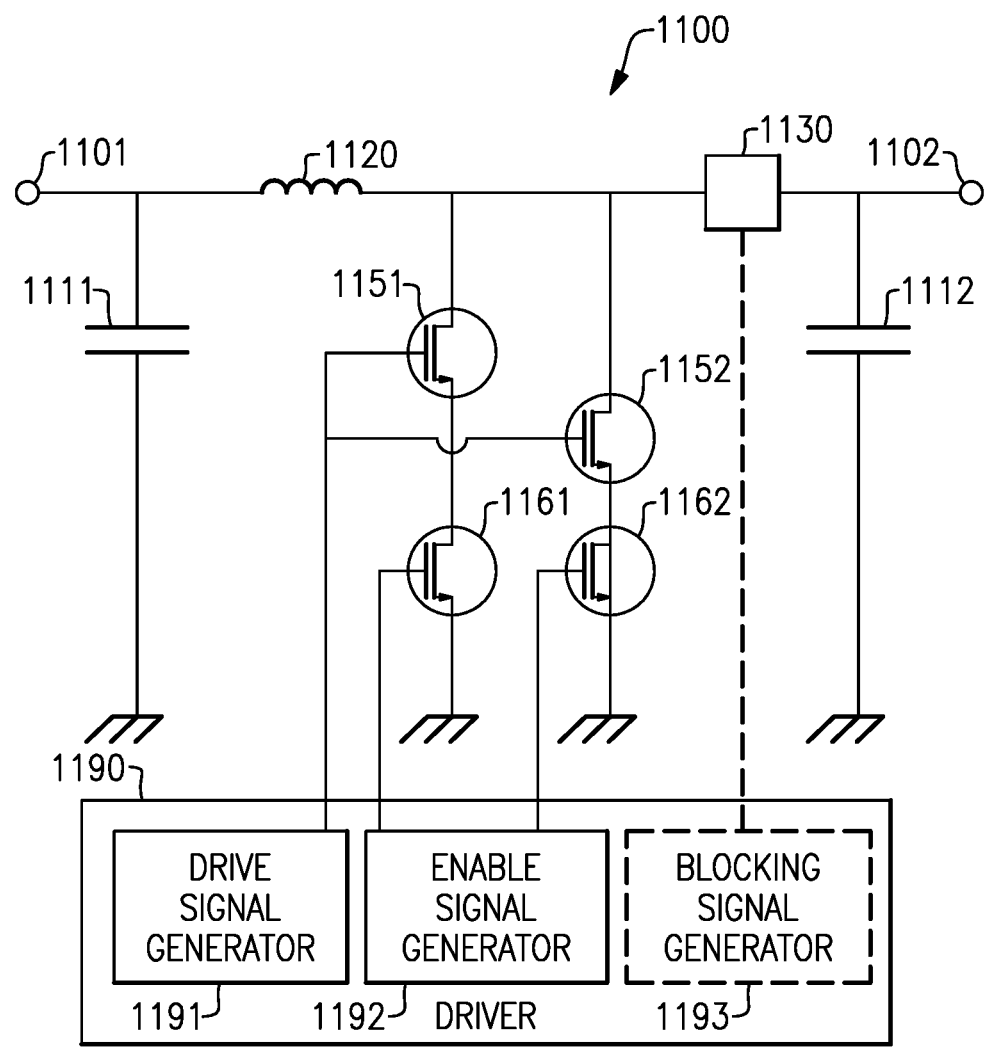
FIG. 11 shows that in some embodiments, a boost converter can include a switch with enabling transistors between a ground potential and drive transistors.

FIG. 11 shows that in some embodiments, a boost converter 1100 can include a switch with enabling transistors 1161-1162 between a ground potential and drive transistors 1151-1152. Like the boost converter 700 of FIG. 7, the boost converter 1100 of FIG. 11 includes a first capacitor 1111 coupling an input node 1101 to a ground potential and a second capacitor 1112 coupling an output node 1102 to the ground potential. The boost converter 1100 further includes an inductor 1120 coupling to the input node 1101 to an intermediate node and a blocking semiconductor device 1130 (which can be implemented as a diode or one or more transistors) coupling the intermediate node to the output node 1102.

Also, like the boost converter 700 of FIG. 7, the boost converter 1100 of FIG. 1100 includes a switch implemented (in part) as a plurality of drive transistors 1151-1152 connected in parallel. Each one of the plurality of drive transistors 1151-1152 has a gate coupled to a drive signal output of a drive signal generator 1191 of a driver module 1190, a drain coupled to the intermediate node, and a source coupled (via a respective enabling transistor 1161-1162) to the ground potential.

The enabling transistors 1161-1162 are disposed between the ground potential and the drive transistors 1151-1152. Each one of the enabling transistors 1161-1162 has a gate coupled to a respective enable signal output of an enable signal generator 1192 of the driver module 1190, a drain coupled to the source of a respective drive transistor 1151-1152, and a source coupled to the ground potential.

Like the switch configuration of FIG. 10, the switch configuration of FIG. 11 allows for a single drive signal output to be used for multiple drive transistors. The drive signal can be, for example, an oscillating signal as shown in FIGS. 8A-8B. By selectively enabling or disabling the enabling transistors 1161-1162 (e.g., by biasing or not biasing the enabling transistors 1161-1162), the driver module 1190 can cause the drive signal provided to the drive transistors 1151-1152 to either drive the path from the intermediate node to the ground potential or to be ineffective. As noted above, in some implementations, separating the drive signal generation from the enable signal generation (and the selection of one or more drive transistors based on a control signal indicative of an output state) may be beneficial. For example, the drive signal generator 1191 and the enable signal generator 1192 may be implemented on different devices or packages.

In some implementations, the driver module 1190 includes a blocking signal generator 1193 to provide one or more blocking signals to one or more blocking transistors of the semiconductor device 1130. In some implementations, the semiconductor device 1130 includes one or more diodes (or, equivalently, one or more transistors configured as diodes) and the driver module 1190 does not include a blocking signal generator 1193.

Figure 12:
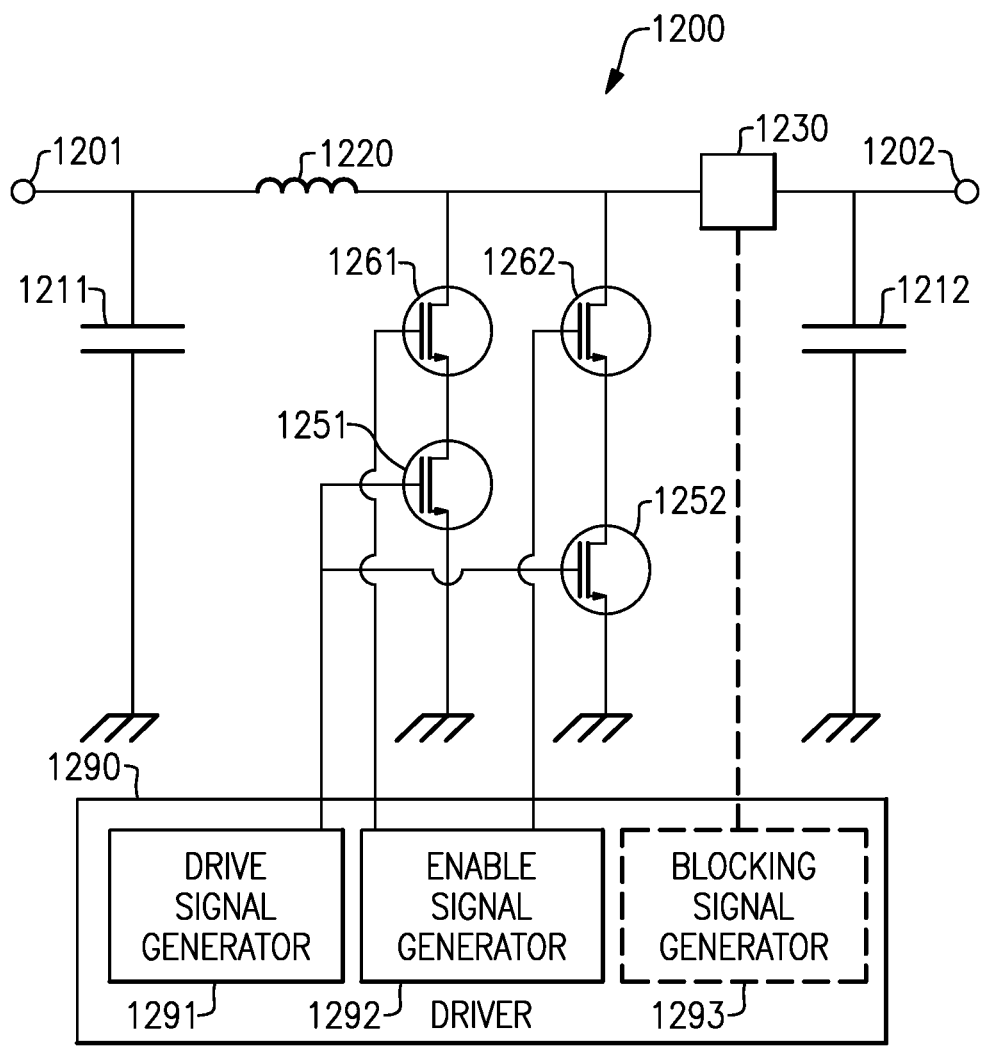
FIG. 12 shows that in some embodiments, a boost converter can include a switch with enabling transistors between an intermediate node and drive transistors.

FIG. 12 shows that in some embodiments, a boost converter 1200 can include a switch with enabling transistors 1261-1262 between an intermediate node and drive transistors 1251-1252. Like the boost converter 700 of FIG. 7, the boost converter 1200 of FIG. 12 includes a first capacitor 1211 coupling an input node 1201 to a ground potential and a second capacitor 1212 coupling an output node 1202 to the ground potential. The boost converter 1200 further includes an inductor 1220 coupling to the input node 1201 to an intermediate node and a blocking semiconductor device 1230 (which can be implemented as a diode or one or more transistors) coupling the intermediate node to the output node 1202.

Also, like the boost converter 700 of FIG. 7, the boost converter 1200 of FIG. 1200 includes a switch implemented (in part) as a plurality of drive transistors 1251-1252 connected in parallel. Each one of the plurality of drive transistors 1251-1252 has a gate coupled to a drive signal output of a drive signal generator 1291 of a driver module 1290, a drain coupled (via a respective enabling transistor 1261-1621) to the intermediate node, and a source coupled to the ground potential.

The enabling transistors 1261-1262 are disposed between the intermediate node and the drive transistors 1251-1252. Each one of the enabling transistors 1261-1262 has a gate coupled to a respective enable signal output of an enable signal generator 1292 of the driver module 1290, a drain coupled to the intermediate node, and a source coupled to the drain of a respective drive transistor 1251-1252.

Like the switch configuration of FIG. 10, the switch configuration of FIG. 12 allows for a single drive signal output to be used for multiple drive transistors. The drive signal can be, for example, an oscillating signal as shown in FIGS. 8A-8B. By selectively enabling or disabling the enabling transistors 1261-1262 (e.g., by biasing or not biasing the enabling transistors 1261-1262), the driver module 1290 can cause the drive signal provided to the drive transistors 1251-1252 to either drive the path from the intermediate node to the ground potential or to be ineffective. As noted above, in some implementations, separating the drive signal generation from the enable signal generation (and the selection of one or more drive transistors based on a control signal indicative of an output state) may be beneficial. For example, the drive signal generator 1291 and the enable signal generator 1292 may be implemented on different devices or packages.

In some implementations, the driver module 1290 includes a blocking signal generator 1293 to provide one or more blocking signals to one or more blocking transistors of the semiconductor device 1230. In some implementations, the semiconductor device 1230 includes one or more diodes (or, equivalently, one or more transistors configured as diodes) and the driver module 1290 does not include a blocking signal generator 1293.

Figure 13:
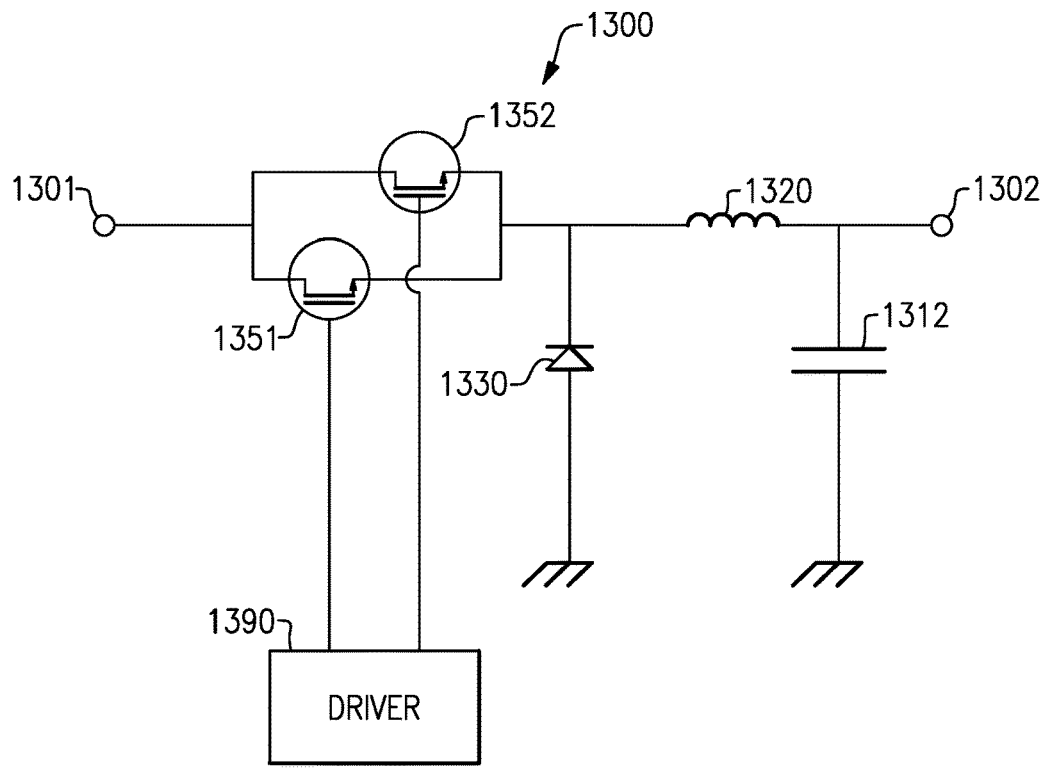
FIG. 13 shows that in some embodiments, a buck converter may include a geometrically scalable switch.

FIG. 13 shows that in some embodiments, a buck converter 1300 may include a geometrically scalable switch. The buck converter 1300 includes a switch (implemented as a plurality of drive transistors 1351-1352 coupled in parallel) coupling an input node 1301 to an intermediate node and an inductor 1320 coupling the intermediate node to an output node 1302. The buck converter 1300 includes a capacitor 1312 coupling the output node to a ground potential and a diode coupling the ground potential to the intermediate node.

Figure 14:
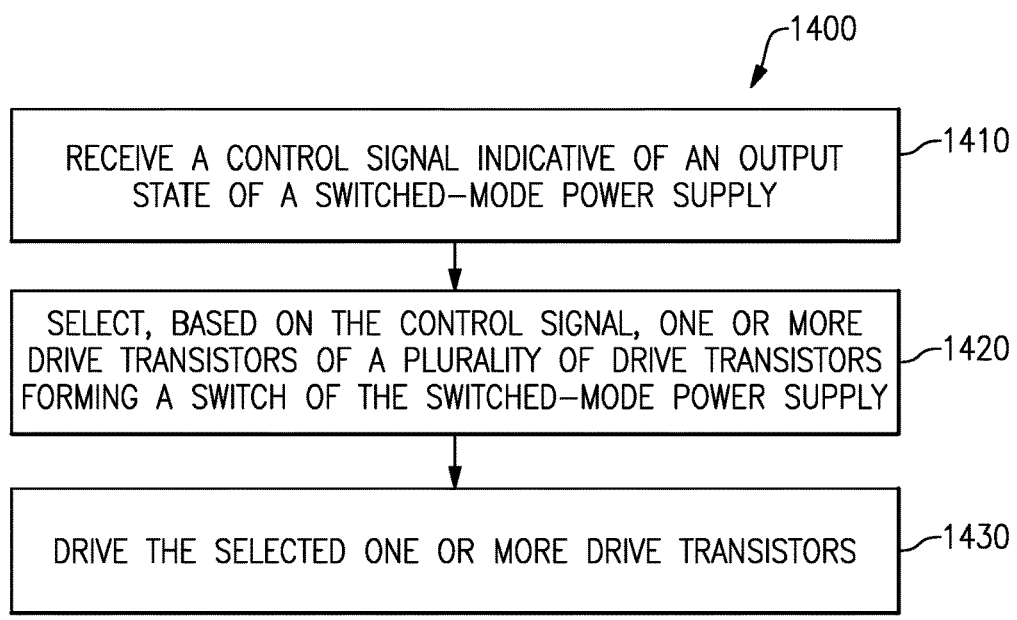
FIG. 14 shows a flowchart representation of a method of controlling a switched-mode power supply (SMPS).

FIG. 14 shows a flowchart representation of a method of controlling a switched-mode power supply (SMPS). In some implementations (and as detailed below as an example), the method 1400 is at least partially performed by a controller, such as the driver module 790 of FIG. 7. In some implementations, the method 1400 is at least partially performed by processing logic, including hardware, firmware, software, or a combination thereof. In some implementations, the method 1400 is at least partially performed by a processor executing code stored in a non-transitory computer-readable medium (e.g., a memory).

The method 1400 begins, at block 140, with the controller receiving a control signal indicative of an output state of the SMPS. The output state can be, for example, a high current output state or a low current output state. In some embodiments, the output state can be a medium current output state. In some embodiments, the output state can be a high power output state or a low power output state.

At block 1420, the controller selects, based on the control signal, one or more drive transistors of a plurality of drive transistors forming a switch of the SMPS.

At block 1430, the controller drives the selected one or more drive transistors. In some embodiments, the controller drives the selected one or more drive transistors by providing separate drive signals to each of the drive transistors. In some embodiments, the controller drives the selected one or more drive transistors by providing a common drive signal to each of the drive transistors and providing separate enable (or disable) signals to respective enable transistors.

Figure 15:
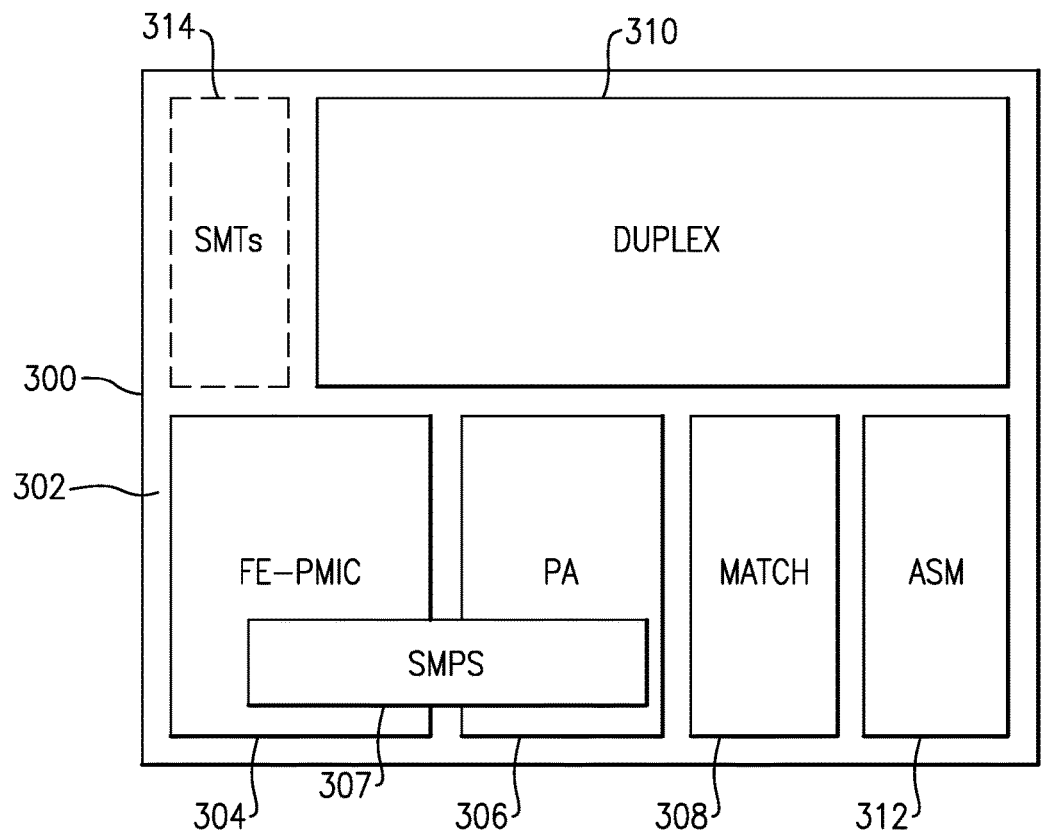
FIG. 15 depicts a module having one or more features as described herein.

FIG. 15 shows that in some embodiments, some or all of power amplification systems (e.g., those shown in FIGS. 5-13) can be implemented, wholly or partially, in a module. Such a module can be, for example, a front-end module (FEM). In the example of FIG. 15, a module 300 can include a packaging substrate 302, and a number of components can be mounted on such a packaging substrate. For example, an FE-PMIC component 304, a power amplifier assembly 306, a match component 308, and a duplexer assembly 310 can be mounted and/or implemented on and/or within the packaging substrate 302. The power amplifier assembly 306 may include a SMPS 307 such as those described above with respect to FIGS. 5-13. Other components such as a number of SMT devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 16:
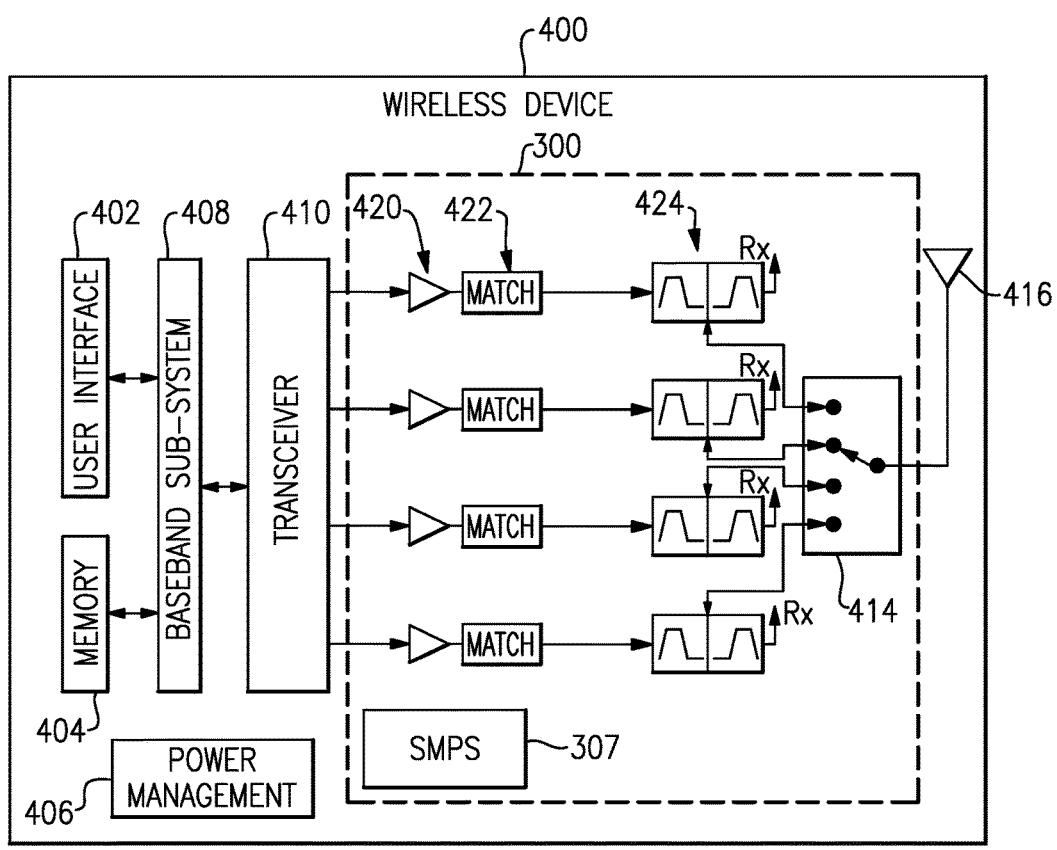
FIG. 16 depicts a wireless device having one or more features described herein.

FIG. 16 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 16, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 424. Such amplified and filtered signals can be routed to an antenna 416 through an antenna switch 414 for transmission. In some embodiments, the duplexers 424 can allow transmit and receive operations to be performed simultaneously using a common antenna (e.g., 416). In FIG. 16, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, one or more features of the present disclosure can provide a number of advantages when implemented in systems such as those involving the wireless device of FIG. 16. For example, the disclosed architecture may enable effective resizing of the drive transistor of a switched-mode power supply (SMPS) to reduce parasitics during lower power operation.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power converter comprising:
an inductor coupled between an input node and an intermediate node;
a semiconductor device coupled between the intermediate node and an output node;
a plurality of drive transistors, each one of the plurality of drive transistors having a drain coupled to the intermediate node and a source coupled to a ground potential; and
a plurality of enable transistors, each respective one of the enable transistors coupled to a respective one of the plurality of drive transistors to permit a first current path through the respective drive transistor only upon biasing a gate of the respective enable transistor enough to provide a second current path through the respective enable transistor.

2. The power converter of claim 1 further comprising a driver module, each one of the plurality of drive transistors having a gate coupled to the driver module.

3. The power converter of claim 2 wherein the driver module is configured to selectively drive one or more of the plurality of drive transistors.

4. The power converter of claim 2 wherein the driver module is configured to apply an oscillating waveform to at least one of the plurality of drive transistors.

5. The power converter of claim 2 wherein the driver module is configured to receive a control signal indicative of an output state and selectively drive one or more of the plurality of drive transistors based on the control signal.

6. The power converter of claim 2 wherein the driver module is configured to, for a first output state, drive a first one and a second one of the plurality of drive transistors and is configured to, for a second output state, drive the first one and not drive the second one of the plurality of drive transistors.

7. The power converter of claim 6 wherein the first output state is a high current output state and the second output state is a low current output state.

8. The power converter of claim 2 wherein the driver module is further configured to control the semiconductor device.

9. The power converter of claim 1 wherein the semiconductor device includes a diode.

10. The power converter of claim 1 wherein the semiconductor device includes a transistor.

11. The power converter of claim 10 wherein the semiconductor device includes a plurality of transistors connected in parallel.

12. The power converter of claim 1 further comprising a capacitor coupled between the input node and the ground potential.

13. The power converter of claim 1 further comprising a capacitor coupled between the output node and the ground potential.

14. The power converter of claim 1 wherein each one of the enable transistors is coupled between a respective one of the plurality of drive transistors and a driver output of the driver module, each one of the enable transistors having the gate coupled to a respective enable output of the driver module.

15. The power converter of claim 1 wherein each one of the enable transistors is coupled between a respective one of the plurality of drive transistors and the ground potential or the intermediate node, each one of the enable transistors having the gate coupled to a respective enable output of the driver module.

16. The power converter of claim 1 wherein the plurality of drive transistors form a switch of a boost converter.

17. The power converter of claim 1 wherein the plurality of drive transistors includes at least one field-effect transistor.

18. A radio-frequency module comprising:
a packaging substrate configured to receive a plurality of components; and
a power converter implemented on the packaging substrate, the power converter including an inductor coupled between an input node and an intermediate node, a semiconductor device coupled between the intermediate node and an output node, and a plurality of drive transistors, each one of the plurality of drive transistors having a drain coupled to the intermediate node and a source coupled to a ground potential, and a plurality of enable transistors, each respective one of the enable transistors coupled to a respective one of the plurality of drive transistors to permit a first current path through the respective drive transistor only upon biasing a gate of the respective enable transistor enough to provide a second current path through the respective enable transistor.

19. The radio-frequency module of claim 18 wherein the radio-frequency module is a front-end module.

20. A wireless device comprising:
a transceiver configured to generate a radio-frequency signal;
a front-end module in communication with the transceiver, the front-end module including a packaging substrate configured to receive a plurality of components, the front-end module further including a power converter implemented on the packaging substrate, the power converter including an inductor coupled between an input node and an intermediate node, a semiconductor device coupled between the intermediate node and an output node, and a plurality of drive transistors, each one of the plurality of drive transistors having a drain coupled to the intermediate node and a source coupled to a ground potential, and a plurality of enable transistors, each respective one of the enable transistors coupled to a respective one of the plurality of drive transistors to permit a first current path through the respective drive transistor only upon biasing a gate of the respective enable transistor enough to provide a second current path through the respective enable transistor, the front-end module further including a power amplifier powered by the power converter and configured to amplify the radio-frequency signal; and an antenna in communication with the front-end module, the antenna configured to transmit the amplified radio-frequency signal.

\* \* \* \* \*